United States Patent [19]

Mohr et al.

[11] Patent Number: 4,510,227

[45] Date of Patent: Apr. 9, 1985

[54] LIGHT-SENSITIVE AQUEOUS DEVELOPABLE COPYING MATERIAL AND PRODUCT BY COATING PROCESS THEREOF UTILIZING POLYSILOXANE AND ALKYLENE OXIDE COPOLYMER AS COATING AID

[75] Inventors: Dieter Mohr; Kurt Riess, both of Wiesbaden, Fed. Rep. of Germany

[73] Assignee: Hoechst Aktiengesellschaft, Frankfurt am Main, Fed. Rep. of Germany

[21] Appl. No.: 523,358

[22] Filed: Aug. 15, 1983

Related U.S. Application Data

[63] Continuation of Ser. No. 273,004, Jun. 12, 1981, abandoned.

[30] Foreign Application Priority Data

Jun. 14, 1980 [DE] Fed. Rep. of Germany ....... 3022473

[51] Int. Cl.$^3$ .................. G03C 1/60; G03C 1/495; G03C 1/68; G03G 5/00
[52] U.S. Cl. ........................... 430/175; 430/49; 430/83; 430/96; 430/133; 430/159; 430/169; 430/177; 430/192; 430/270; 430/271; 430/272; 430/300; 430/281; 430/303; 430/325; 430/326; 430/905
[58] Field of Search ............... 430/169, 175, 177, 303, 430/637, 159, 272, 905, 49, 83, 96, 133, 281, 270, 271, 192, 300, 325, 326

[56] References Cited

U.S. PATENT DOCUMENTS

| | | | |
|---|---|---|---|
| 3,545,970 | 12/1970 | Giorgianni et al. | 430/376 |
| 3,647,444 | 3/1972 | Borden et al. | 430/285 |
| 3,671,240 | 6/1972 | Gramza et al. | 430/254 |
| 3,779,774 | 12/1973 | Cope et al. | 430/152 |
| 3,816,915 | 1/1975 | Cawley | 430/89 |
| 3,953,212 | 4/1976 | Miyano et al. | 430/303 |
| 4,092,170 | 5/1978 | Houtermans et al. | 430/175 |
| 4,116,786 | 9/1978 | Hodakowski | 430/908 |
| 4,271,261 | 6/1981 | Shimizu et al. | 430/294 |

FOREIGN PATENT DOCUMENTS 423087 8/1974 U.S.S.R. ............................ 430/637

OTHER PUBLICATIONS

Anon, *Research Disclosure*, #11418, 10/1973, pp. 38–41.
Joseph et al., *Research Disclosure*, #14522, 5/1976, p. 15.

*Primary Examiner*—Charles L. Bowers, Jr.
*Attorney, Agent, or Firm*—Schwartz, Jeffery, Schwaab, Mack, Blumenthal & Koch

[57] ABSTRACT

The present application describes a light-sensitive copying material comprising a support and a light-sensitive layer which contains a surface-active polysiloxane comprised of dialkyl siloxane units and oxyalkylene units. By the addition of the polysiloxane a more uniform coating is achieved, even if only a single solvent is used for the coating solution.

10 Claims, No Drawings

LIGHT-SENSITIVE AQUEOUS DEVELOPABLE COPYING MATERIAL AND PRODUCT BY COATING PROCESS THEREOF UTILIZING POLYSILOXANE AND ALKYLENE OXIDE COPOLYMER AS COATING AID

This is a continuation of application Ser. No. 273,004, filed June 12, 1981, now abandoned.

BACKGROUND OF THE INVENTION

The present invention relates to a light-sensitive copying material and to a process for the manufacture of such material, which includes the general steps of coating a support with a solution of the components of the light-sensitive layer which are dissolved in a solvent, preferably in an organic solvent, and drying the layer.

Usually, light-sensitive copying materials of various descriptions are manufactured in such a way that supports consisting of metals, plastic films, paper, fabrics and the like are coated as evenly as possible with solutions of the layer components, and these solutions are then dried under conditions which ensure the formation of layers which are as uniform as possible.

The layer components used generally comprise light-sensitive or photoconductive compounds or combinations of such compounds, binders, dyes, pigments, plasticizers, fillers, polymerizable compounds, stabilizers and the like. The components are preferably dissolved in organic solvents and, occasionally, also in water or mixtures of water and organic solvents.

In industrial scale coating and in continuous manufacturing processes, mixtures of several solvents which have different evaporation numbers are practically always used, in order to obtain a substantially continuous transition from the liquid film phase to the dry layer and to prevent, if possible, any disintegration during drying. In most cases, whis is achieved by a combination of solvents having a good dissolving power with non-solvents; the vapor pressures and evaporation numbers of the components are chosen in such a way that the non-solvents are the first to evaporate in the drying process. Thus, layers of an adequate coating quality are produced, but unless they are colorless, these layers still exhibit a certain irregularity which is referred to as "cloudiness".

The term "cloudiness" denotes the presence of contiguous layer areas of lighter and darker shades which have diameters ranging from about 1 to 10 mm. Scanning electron micrographs (SEM) of sections through copying layers have revealed that variations in color density can be attributed to differences in the layer thickness.

It is presumed that, until the gel phase is reached in the drying process, the still liquid layer is subject to whirling effects or agitations of substance, which are caused by changes in the surface tension of the layer in the course of drying. Evaporation of the solvent gives rise to two factors which mutually intensify each other and raise the surface tension of the drying layer at its interface to the ambient air. On the one hand, the temperature drop leads to a rise in surface tension of the order of 0.1 mN/m/°C.; on the other hand, surface tension is additionally augmented by the increase in concentration of the film-forming substances contained in the solution.

Emanating from numerous small swelling points in the underlying layer of less concentrated solution, material of higher temperature and lower surface tension, forces its way to the surface. As a result, corresponding centers are formed on the surface and from these centers, the liquid rising from below spreads, until the fronts of the spreading waves of adjacent centers meet. Due to a deviation of the liquid agitation into the interior of the layer, turbulences are produced.

This phenomenon is, to a particularly high degree, encountered in the manufacture of light-sensitive printing plates, especially of planographic printing plates, where relatively highly diluted solutions of low viscosity are frequently used. Layers which are cloudy and have non-uniform thicknesses and colorations are often obtained, and such irregularities in layer-thickness have a negative effect on the printing result, particularly in plates for screenless offset printing. Here, the surface structure of the plate is reproduced on the impression in gray tone steps, i.e., uniform gray areas are not printed.

From Research Disclosure (1976) 145, page 15, No. 14522, it is known to add a combination of a non-ionic surfactant, i.e., isononyl phenoxy decaglycidol, and an anionic surfactant, i.e., an ammonium salt of sulfated nonyl phenoxy poly(ethyleneoxy)ethanol, to lithographic layers to improve the coatability of the coating solution and to ensure good inking properties. Other, less active surfactant combinations which are mentioned, are the alkyl aryl polyglycol ether carboxylic acid monoethanolamine salt or polyoxyethylene polymethylsiloxane. According to this description, one surfactant alone is not sufficient to yield the desired properties; the non-ionic surfactant, if used alone, causes a deterioration of ink receptivity and scumming of the background.

German Offenlegungsschrift No. 29 14 558 discloses a coating process in which the uniformity of the light-sensitive layers on planographic printing plates is improved by adding to the coating solution a polymer which has a molecular weight of at least 10,000 and which contains at least one fluoroalkyl group. As stated in the specification, the addition of these polymeric compounds results in a more uniform layer thickness. Although it is mentioned in the description that a number of solvents can be used, individually or in mixtures, for the preparation of the coating solutions, solvent mixtures exclusively are employed in the examples, and in each case, the mixture contains one low-boiling and one high-boiling solvent.

The use of high-molecular weight compounds with fluorinated side chains has, in addition, the disadvantage that these polymers are no longer soluble in all customary solvents, so that the choice of a solvent is limited.

From U.S. Pat. No. 3,779,774 it is known to add particular polysiloxanes which contain oxyalkylene groups and, preferably, hydroxy groups and amino groups, to the light-sensitive layers of vesicular films to improve the resolution and sensitivity of the films by a formation of smaller bubbles. An influence of these additions on the coating quality is not mentioned. As is stated in the publication, saponin or similar surfactants were already earlier used for the same purpose.

SUMMARY OF THE INVENTION

It is therefore an object of the present invention to provide a light-sensitive copying material which can be coated easily with light-sensitive layers of high quality and uniformity.

It is also an object of the invention to provide a light-sensitive copying material which can be produced with a great number of solvents and which, if desired, can be prepared from a solution which comprises only one solvent.

A further object of the invention is to provide an improved process for producing a light-sensitive copying material according to the invention.

In accomplishing these and other objects, there has been provided in accordance with one aspect of the present invention a light-sensitive copying material, comprising a support sheet; and a light-sensitive layer comprising a material which undergoes a change in solubility in a developer upon exposure to actinic light, and from about 0.01 to 10 percent by weight of a surfactant comprised of a surface-active polysiloxane containing dialkylsiloxane units and oxyalkylene units. Preferably, the surface-active polysiloxane is contained in the light-sensitive layer in a quantity sufficient to reduce in a linear manner by about 40 to 75 percent the spreading capacity on the support sheet of a coating solution containing the layer components and in a quantity sufficient to reduce the surface tension of the light-sensitive layer toward water by 2 to 12 mN/m, as compared with a layer which is free of the polysiloxane.

In accordance with another aspect of the present invention, there has been provided a process for producing a light-sensitive copying material, comprising the steps of coating a support sheet with a solution comprising at least one light-sensitive component and from about 0.005 to 1 percent of a surfactant dissolved in a solvent, to form a thin layer of the solution on the support, wherein the surfactant comprises a surface-active polysiloxane containing dialkylsiloxane units and oxyalkylene units; and drying the thin layer to remove the solvent therefrom to produce a light-sensitive layer on the support layer.

Further objects, features and advantages of the present invention will become apparent from the detailed description of preferred embodiments which follows.

DETAILED DESCRIPTION OF PREFERRED EMBODIMENTS

The invention is based on a light-sensitive copying material comprising a support and a light-sensitive layer which, upon exposure to actinic light, undergoes a change of solubility in a developer and which contains a surfactant. The copying material of the invention is characterized in that the layer contains as the surfactant a surface-active polysiloxane which comprises dialkylsiloxane units and oxyalkylene units and is present in a quantity ranging from about 0.01 to 10 percent by weight.

According to the invention, a process is also provided for coating a support with a light-sensitive copying layer. The process comprises dissolving the layer components, together with a surfactant, in a solvent, applying the solution to the support to form a thin, uniform layer thereon and drying the layer by evaporation of the solvent, preferably at elevated temperature. The process has the feature that from about 0.005 to 1 percent by weight, preferably from about 0.01 to 0.05 percent by weight of a surface-active polysiloxane which is composed of dialkylsiloxane units and oxyalkylene units is added to the coating solution.

The surface-active polysiloxanes which are added to the coating solution according to the invention, are preferably comprised of units of the formulae:

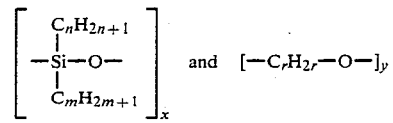

in which m and n are integers ranging from 1 to 4, preferably 1 or 2, r is an integer ranging from 2 to 5, preferably 2 or 3, x is an integer ranging from about 10 to 100, preferably from about 20 to 60, and y is an integer ranging from about 25 to 350, preferably from about 50 to 200.

The molecular weights of the surface-active polysiloxanes are in the range from about 1,800 to 40,000, preferably from about 3,500 to 16,000.

The action of the surfactants depends essentially on the solvent used, whereas the chemical nature and composition of the dissolved or dispersed components of the layer, particularly of the light-sensitive substances, is of minor importance.

For each layer composition, a suitable solvent can easily be determined by preliminary tests. The added surfactant, if used in concentrations within the above-specified ranges, reduces the surface tension of the respective coating solution toward air by 1 to 6 mN/m. The surface tension of the dry layer toward water is reduced by 2 to 10, preferably 5 to 8 mN/m, by the surfactant addition.

Due to their strong surface-active effect, the surfactants concentrate at the interfaces of the coating solution. Especially in the case of rough support surfaces which have a very high surface tension, this leads, surprisingly, to a reduction of the spreading tendency of the solution. It is assumed that also the spreading of liquid phases which are in their early drying stages and have low concentrations on film phases in advanced drying stages is largely suppressed by the concentration of the surfactants at the interfaces. Agitations of the liquid film during drying are thus probably strongly inhibited and layers are produced which have an improved uniformity after drying.

Only few of the numerous well-known surfactants, however, show this positive effect. It is considered decisive for the action of the surfactants described in the present application that siloxane units and oxyalkylene units are combined in one molecule. Although these surfactants, on account of their pronounced surface-active properties and relatively low molecular weights, are concentrated to a considerable degree at the interfaces of the layer being formed, they impair neither the image differentiation upon development or the oleophilic properties of the image areas which are insoluble in the developer, nor the hydrophilic properties of the decoated areas of the support surface or the print run of the printing form obtained.

The spreading capacity of the coating solution has proved to be a further measure of the suitability of a surfactant and a means of determining the appropriate range of concentration of the surfactant in the solution. The spreading capacity is easily determined by applying a defined quantity of the solution to a specific support and measuring the diameter of the wetting zone after drying at room temperature. The support consists, appropriately, of a material of very uniform surface roughness, for example, electrolytically roughened aluminum, because on such a material the effects which may be observed appear most clearly and are reproducible with the highest degree of certainty.

The values for the spread-inhibiting action of a surfactant, which are determined on such a support material represent good approximate values which may be applied to the behavior of this surfactant on an entirely different support material (for example, polyester film).

By adding the above-defined surfactants to the coating solution, the spreading capacity of the solution is intended to be reduced by about 40 to 75 percent, preferably by about 50 to 70 percent, relative to the diameter of the wetting zone.

When coating customary support materials (for example, aluminum) cloud-free, optically homogeneous copying layers of uniform coloration and layer thickness are obtained, even if very small amounts of the surfactants (less than about 0.1 percent) are added to the coating solution, which further contains light-sensitive or photoconductive substances, and optionally binders, dyes and other usually employed components, dissolved in a conventional mixture of a high-boiling and a low-boiling solvent, for example, ethylene glycol monomethyl ether/tetrahydrofuran or ethylene glycol monomethyl ether/butyl acetate/tetrahydrofuran. In view of their coating quality, the copying layers thus produced are superior to the standard which is presently normal and achievable, in particular in presensitized planographic printing plates.

Suitable solvents for the coating solutions are, for example, the known glycol derivatives, amides, chlorinated hydrocarbons, and ketones, for example, ethylene glycol monomethyl ether, ethylene glycol monoethyl ether, ethylene glycol monoisopropyl ether, dimethyl formamide, butyrolactone, methylene dichloride, dichloroethane or butanone. It is possible to blend the solvents mentioned with other solvents in which the substances to be dissolved are not necessarily soluble; among these number, primarily, ethers and esters, such as dioxane, tetrahydrofuran, butyl acetate and ethylene glycol methyl ether acetate.

In combination with the surface-active polysiloxane glycol monoalkyl ethers, for example, ethylene glycol monomethyl ether, glycol ether esters, for example, ethylene glycol methyl ether acetate or chlorinated hydrocarbons, for example, dichloroethane, have proved to be particularly suitable as components of good dissolving power.

In ketones, for example, cyclohexanone or butanone, which are used as solvents, the levelling action is reduced, and the range for the addition of the polysiloxane is limited. In cyclic ethers, for example, tetrahydrofuran, esters, for example, butyl acetate, and in alcohols, for example, ethanol, the influence of the surface-active polysiloxanes is negligible.

By adding the specified surfactants to the coating solution it is, surprisingly, rendered possible to do with only one solvent and to obtain layers which are of better quality than those which could, up to now, be prepared by means of the above-described solvent combinations. It is obvious that reclaiming and purifying a single solvent is considerably easier technologically than the corresponding processing of solvent mixtures. In particular, it is much easier to remove a relatively high-boiling solvent from the exhaust air than a mixture consisting of high-boiling and low-boiling constituents.

As the solvents which are used alone, the above-mentioned good-dissolving compounds, particularly the glycol monoethers, are suitable. Due to their good solvent power for various substances, they may be universally employed for copying layers of different types, for example, layers based on negative-acting or positive-acting diazo compounds, photopolymerizable layers, photoconductive layers, etc. It is also possible to advantageously coat widely different support materials according to the process of the present invention.

Apart from the above-stated, generally valid advantages which are obtained in the production of printing plates when one solvent only is employed, it has surprisingly been found to be additionally possible, by using particular solvents, such as glycol monoethers, e.g., ethylene glycol monomethyl ether, as the only solvent of coating solutions for the manufacture of presensitized printing plates, particularly of planographic printing plates, to achieve advantages in the copying behavior of such plates, in comparison with materials produced from solvent mixtures, but without surfactant addition.

Depending on the kind of the light-sensitive system, the following advantages appear: better contrast upon exposure, shorter developing time, reduced consumption of developer, improved developer resistance, higher light-sensitivity, higher resolution and/or reduced tendency to halations. In a particular type of printing plate, these advantages are usually not all encountered at the same time, and they are more or less pronounced according to the plate type concerned.

Differences in the printing behavior, for example, ink receptivity, water acceptance and length of print run, are usually not observed between planographic printing plates coated from glycol ethers with an addition of the surface-active polysiloxanes and others which were coated from solvent mixtures without surfactant addition.

The light-sensitive layers which can be applied to supports using the surfactants may vary widely in nature and composition. The term "light-sensitive layer" as herein used shall be understood as including layers having a light-sensitivity which is only activated by a pretreatment, for example, by application of an electrostatic charge, i.e., electrophotographic layers.

Similarly, layers are herein incorporated which are prepared in two stages, for example, resin or binder layers which are rendered light-sensitive only after subsequently soaking or impregnating with a solution of a light-sensitive substance, for example, a dichromate or a diazo compound. In that case, the surfactant which is added according to the invention is used in the first stage, i.e., in the actual production of the layer. In addition, layers which are industrially manufactured, such as in presensitized printing plates, and layers which are applied by the user of the light-sensitive material, i.e., photoresist layers or the layers in wipe-on printing plates, are also included. The invention further covers reprographic copying layers which are insensitive to visible or long-wave ultraviolet light, but are sensitive to high-energy radiation, such as electron or laser radiation. In principle, the invention is applicable to any reprographic layers in which it is important to have a uniform, homogeneous structure and layer thickness.

The light-sensitive systems concerned include all those wherein solubility in a developer is changed upon exposure or irradiation, respectively, that is to say, mixtures which are hardened by exposure to light (negative) and mixtures which are rendered soluble by exposure to light (positive). Also suitable are those electrophotographic systems, with the aid of which a charge image, optionally a toner image, is first produced and is then used to form a relief image, for example, for the production of a printing form, by transferring the charge image or toner image or by decoating the areas of the plate which are not covered by the toner image.

Suitable light-sensitive mixtures are, above all, those which are based on positive-acting or negative-acting diazo compounds, for example, based on o-quinone diazides or diazonium salt polycondensation products. These mixtures often contain film-forming resins or binders. German Offenlegungsschriften No. 23 31 377, No. 25 47 905 and No. 28 28 037 disclose suitable positive-acting layers of that kind, while negative-acting layers of the type specified are described, for example, in U.S. Pat. No. 3,867,147. The disclosure of each of these published documents is hereby incorporated by reference.

Also suitable are positive-acting mixtures based on compounds which contain acid-cleavable orthocarboxylic acid groups or acetal groups and photolytic acid donors, as described, for example, in German Patent No. 26 10 842 and in German Offenlegungsschriften No. 27 18 254 and No. 29 28 636, the disclosures of which are also incorporated herein by reference.

It is further possible to employ photopolymerizable mixtures composed of ethylenically unsaturated polymerizable compounds, photoinitiators and, optionally, polymeric binders, for example, as described in U.S. Pat. No. 2,760,863, German Pat. No. 20 27 467 and German Offenlegungsschriften No. 20 64 079, No. 23 63 806 and No. 28 22 190. These disclosures are also incorporated herein by reference.

As has already been mentioned above, photoconductive materials comprising inorganic or organic photoconductors and, if appropriate, polymeric binders can also be used, for example, as disclosed in German Pat. No. 23 22 047, No. 15 22 497 and No. 18 11 209 and in German Auslegeschrift No. 27 26 116, which are also incorporated herein by reference.

Suitable supports are those which are known in the art, i.e., metals, for example, aluminum, copper, chromium-plated copper or brass, steel and the like, plastic sheets, for example, consisting of cellulose acetate or polyethylene terephthalate, copper-clad molded-resin plates etc.

Coating can be accomplished by roller application, dip coating, slot-die coating, casting, etc. The levelling effect of the added surfactants is only slightly or even not at all influenced by the method used to apply the coating solution.

The desired relief image is produced on the coated copying materials obtained according to the process of the present invention, in the conventional manner, by image-wise exposing or irradiating and washing out the non-image areas with a developer, preferably an aqueous developer solution. In the developing procedure, the surfactants contained in the layer are, together with the soluble layer areas, completely removed from the non-image areas, so that the support which has been uncovered in these areas does not show any scumming propensity.

In the preceding description and in the examples which follow, reference is mainly made to the manufacture of planographic printing masters, which is the most important field of application for the process and material according to the invention. The invention is advantageously also used in the production of other types of printing plates, such as letterpress or intaglio printing plates or in the manufacture of photoresists and other reprographic materials, where it is important to apply light-sensitive or radiation-sensitive layers of uniform thickness and unchanging quality.

Preferred embodiments of the invention are explained in the following examples. In the examples, parts by weight (p.b.w.) and parts by volume (p.b.v.) have the same relationship as the g to the $cm^3$. Unless otherwise specified, percentages and weight ratios are to be understood as denoting units by weight. The examples are intended to be illustrative only and in no sense limiting.

EXAMPLE 1

An electrolytically roughened and anodized aluminum web was coated by means of a slot die with the following solution:

6.6 p.b.w. of a cresol formaldehyde novolak having a softening range from 105° to 120° C., according to DIN 53 181, 1.1 p.b.w. of the 4-(2-phenyl-prop-2-yl)-phenylester of naphthoquinone-(1,2)-diazide-(2)-sulfonic acid-(4), 0.6 p.b.w. of 2,2'-bis-[naphthoquinone-(1,2)-diazide-(2)-sulfonyloxy-(5)]-dinaphthyl-(1,1')-methane, 0.24 p.b.w. of naphthoquinone-(1,2)-diazide-(2)sulfochloride-(4), 0.08 p.b.w. of Crystal Violet, 0.02 p.b.w. of a copolymer of dimethyl dichlorosilane, ethylene oxide and propylene oxide, having a viscosity of 9 $cm^2$/second at 25° C. and a surface tension of 18 mN/m, and 91.36 p.b.w. of a solvent mixture composed of 4 p.b.v. of ethylene glycol monomethyl ether, 5 p.b.v. of tetrahydrofuran and 1 p.b.v. of butyl acetate.

The coated web was dried by passing it through a drying channel at temperatures up to 120° C.

The resulting layer had an entirely uniform appearance, free from cloudy irregularities. Small coating defects could thus easily be detected within the scope of a prolonged production cycle.

The printing plates were exposed under a positive original and developed using a developer of the following composition:

5.3 p.b.w. of sodium metasilicate $\times 9H_2O$, 3.4 p.b.w. of trisodium phosphate $\times 12H_2O$, 0.3 p.b.w. of sodium dihydrogen phosphate (anhydrous) and 91.0 p.b.w. of water.

The printing forms obtained did not show any copying or printing defects.

In the same manner as described above, printing plates were produced by coating with a solution which did not contain any surface-active polysiloxane, but which, otherwise, had the same composition as the above-described coating solution.

In this case, the copying layers had an irregular appearance and a non-uniform coloration. They exhibited lighter and darker zones which were approximately equally distributed with respect to size and number and were more or less strongly elongated in the coating direction. On an average, about 3 to 5 light and dark zones were perceivable in each $cm^2$ of the surface. The appearance of such layers is generally called "cloudy".

The printing forms prepared as described in the paragraph before last had the same copying and printing behavior as the printing forms prepared according to the present invention.

EXAMPLE 2

The procedure of Example 1 was repeated; however, in the coating solution the above-specified solvent mixture was replaced by the same quantity of ethylene glycol monomethyl ether as the only solvent. The coating quality obtained was the same as in Example 1.

Upon exposure, the printing plates thus produced showed a markedly higher image contrast, a slightly increased sensitivity to light and a reduced tendency to halations, as against the comparative plates described in Example 1, which had been prepared without an addition of a surface-active polysiloxane, but with a solvent mixture.

When developing the exposed printing plates with a 20 percent reduced quantity of developer, the developing time could be shortened by 14 percent, as compared to the above-mentioned comparative plates.

With respect to ink receptivity, water acceptance and print run, no difference to the comparative plate could be observed.

If, in lieu of ethylene glycol monomethyl ether, the same quantity of cyclohexanone or methyl ethyl ketone was used as the only solvent, essentially the same results were obtained as far as the coating quality and the copying and printing behavior of the plates were concerned. If the surfactant was entirely omitted in an otherwise identical coating solution, an extremely cloudy, irregular copying layer of unacceptable coating quality resulted.

EXAMPLE 3

A solution of 1.50 p.b.w. of the ester of 1 mole of 2,4-dihydroxy-3,5-dibromo-benzophenone and 2 moles of naphthoquinone-(1,2)-diazide-(2)-5-sulfonic acid, 5.20 p.b.w. of a phenol formaldehyde novolak comprising 14 percent of phenolic OH groups and having a softening range between 110° and 120° C., according to DIN 53 181, 0.20 p.b.w. of polyvinyl butyral, 0.15 p.b.w. of Crystal Violet, 0.08 p.b.w. of Sudan Yellow GGN (Colour Index 11 021), 0.60 p.b.w. of tris-($\beta$-chloroethyl)-phosphate and 0.02 p.b.w. of the surfactant specified in Example 1 in 92.25 p.b.w. of a solvent mixture composed of 40 p.b.v. of ethylene glycol monomethyl ether and 50 p.b.v. of tetrahydrofuran was applied to an aluminum foil which had been roughened by brushing with steel brushes, and the coating was then dried in a drying channel at temperatures up to 110° C.

The positive-acting, presensitized planographic printing plates thus prepared had a very uniform light-sensitive layer. The plates exhibited perfect copying and printing properties.

EXAMPLE 4

A presensitized printing plate was prepared as in Example 3, by coating a support, however, this time the solvent mixture was replaced by the same quantity of ethylene glycol monomethyl ether as the only solvent. The layer on the resulting printing plate corresponded in quality to the layer obtained in Example 3.

The printing plate thus prepared showed the advantages of an easier developability, a better developer resistance of the image areas, and a reduced tendency to halations, as compared to a plate which had been produced according to Example 3, but without addition of a surfactant.

The printing results corresponded approximately to those obtained with the comparative plate.

EXAMPLE 5

An electrolytically roughened and anodized aluminum plate was immersed for 1 minute in water at 60° C. in which 0.3 percent by weight of polyvinyl phosphonic acid had been dissolved; it was then rinsed and dried, then coated with the following solution and dried again:

0.7 p.b.w. of the polycondensation product of 1 mole of 3-methoxy-diphenylamine-4-diazonium sulfate and 1 mole of 4,4'-bis-methoxymethyl-diphenyl ether, precipitated as the mesitylene sulfonate, 3.4 p.b.w. of 85 percent phosphoric acid, 3.0 p.b.w. of a modified epoxy resin, obtained by reacting 50 g of an epoxy resin having a molecular weight below 1,000 with 12.8 g of benzoic acid in ethylene glycol monomethyl ether, in the presence of benzyl trimethyl ammonium hydroxide, 0.44 p.b.w. of finely ground Heliogen Blue G (Colour Index 74 100), 0.02 p.b.w. of a copolymer of dimethyl dichlorosilane and ethylene oxide, comprising about 15 to 25 siloxane units and 50 to 70 oxyethylene units in each molecule and having an average molecular weight of 5,000, 62.0 p.b.w. of ethylene glycol monomethyl ether, 30.6 p.b.w. of tetrahydrofuran and 8.0 p.b.w. of ethylene glycol methyl ether acetate.

The resulting copying layer showed a considerably improved evenness and a more uniform coloration than a copying layer which had been prepared without addition of the surfactant, but which had, otherwise, the same composition. The printing plate had the same copying and printing properties as the comparative plate. The two plates were developed with a solution of 2.8 p.b.w. of $Na_2SO_4 \times 10H_2O$, 2.8 p.b.w. of $MgSO_4 \times 7H_2O$, 0.9 p.b.w. of orthophosphoric acid (85 percent), 0.08 p.b.w. of phosphorous acid, 1.6 p.b.w. of a non-ionic surfactant, 10.0 p.b.w. of benzyl alcohol, 20.0 p.b.w. of n-propanol, 60.0 p.b.w. of water.

EXAMPLE 6

The procedure followed was the same as in Example 5 with the exception that for coating, ethylene glycol monomethyl ether was used as the only solvent, instead of the solvent mixture.

The copying layer obtained showed a high degree of homogeneity and a uniform layer thickness and coloration. Compared with a layer which had been prepared from the solvent mixture of Example 5, without addition of a surfactant, this layer had a higher light sensitivity and an improved resolution.

The developing time required for the layer produced with addition of a surfactant was reduced by 30 percent, compared with the developing time required for the comparative plate. The two plates showed an identical printing behavior.

EXAMPLE 7

An aluminum support which had been roughened by brushing with an aqueous abrasive suspension and then treated with an aqueous solution of polyvinyl phosphonic acid was coated with a solution of the following composition:

0.6 p.b.w. of the diazonium salt condensation product specified in Example 5, 0.06 p.b.w. of phosphoric acid (85 percent), 1.7 p.b.w. of polyvinyl formal (molecular weight 30,000, 7 percent hydroxy groups, 20 to 27 percent acetate groups), 2.7 p.b.w. of a dispersion of a copper phthalocyanine pigment (Colour Index 74 160) in ethylene glycol methyl ether acetate, 0.02 p.b.w. of the surfactant specified in Example 5 and 95 p.b.w. of ethylene glycol monomethyl ether.

The copying layer exhibited an outstanding uniformity.

After imagewise exposure, the layer could be more easily developed than a corresponding layer which, however, had been prepared without addition of a surfactant, from a solvent mixture of 50 parts by weight of ethylene glycol monomethyl ether, 40 parts by weight of tetrahydrofuran and 10 parts by weight of butyl acetate. The layer was developed with the following solution:

5.7 p.b.w. of $MgSO_4 \times 7H_2O$, 25.5 p.b.w. of n-propanol, 1.1 p.b.w. of ethylene glycol mono-n-butyl-ester, 0.7 p.b.w. of alkyl-polyethoxy-ethanol and 67.0 p.b.w. of water.

EXAMPLE 8

The coating solution described in Example 7 was applied to an electrolytically roughened and anodized aluminum support which had been after-treated with an aqueous solution of polyvinyl phosphonic acid.

The presensitized planographic printing plate obtained after drying of the coating, exhibited a high coating quality and, in addition, a slightly higher sensitivity to light; it required a noticeably shorter developing time, yielding a more complete development of the fine line areas, as against a plate which had been coated from a solvent mixture composed of 50 p.b.w. of ethylene glycol monomethyl ether, 40 p.b.w. of tetrahydrofuran and 10 p.b.w. of butyl acetate, however, without surfactant addition.

If, in this example, ethylene glycol monomethyl ether is replaced by dichloroethane as the only solvent, basically the same results are achieved.

EXAMPLE 9

An electrolytically roughened and anodized aluminum plate which had been after-treated with an aqueous solution of polyvinyl phosphonic acid was coated with the following solution:

1 p.b.w. of the diazonium compound specified in Example 5, 0.5 p.b.w. of the polyvinylformal of Example 7, 0.03 p.b.w. of a copolymer of dimethyl dichlorosilane and propylene oxide having an average molecular weight of 7,000, 98.5 p.b.w. of ethylene glycol monomethyl ether.

The presensitized planographic printing plate obtained after drying was imagewise irradiated by means of an argon laser at 10 watts capacity.

The following solution was used for developing:

6.0 p.b.w. of magnesium sulfate, 0.7 p.b.w. of fatty alcohol polyglycol ether, 65.0 p.b.w. of water and 32.0 p.b.w. of n-propanol.

As a comparison, the same layer components were applied to the support from a solvent mixture comprising 40 parts by volume of tetrahydrofuran and 60 parts by volume of ethylene glycol monomethyl ether, however, without addition of the polysiloxane.

The layer on this plate was of a considerably poorer quality and required a noticeably longer exposure time.

If coating was effected from ethylene glycol monomethyl ether as the only solvent and without addition of a surfactant, an extremely cloudy layer showing considerable variations in layer density was obtained.

EXAMPLE 10

A solution of 10 p.b.w. of 2,5-bis-(4'-diethylaminophenyl)-1,3,4-oxadiazole, 10 p.b.w. of a copolymer of styrene and maleic anhydride having an average molecular weight of 20,000 and an acid number of 180, 0.02 p.b.w. of Rhodamine FB (Colour Index 45 170) and 0.02 p.b.w. of the surfactant used in Example 5 in 300 p.b.w. of ethylene glycol monomethyl ether was applied to an aluminum foil which had been electrolytically roughened, anodized and treated with polyvinyl phosphonic acid. A very uniform photoconductor layer without any visible structures had formed after evaporation of the solvent.

The layer was negatively charged in the dark to about 400 V by means of a corona. The charged plate was then imagewise exposed in a reprocamera and developed using an electrophotographic suspension developer obtained by dispersing 3.0 g of magnesium sulfate in a solution of 7.5 g of a pentaerythritol resin ester in 1,200 ml of an isoparaffin mixture having a boiling range from 185° to 210° C. Any excess developer liquid was removed and the plate was dipped for 60 seconds into a solution of 35 p.b.w. of sodium metasilicate $\times 9H_2O$.

140 p.b.v. of glycerol, 550 p.b.v. of ethylene glycol and 140 p.b.v. of ethanol.

It was then rinsed with a strong jet of water so that any parts of the photoconductor layer which were not covered by the toner were removed. The plate was then ready for printing.

Since the surfactant used was a non-ionogenic substance, the chargeability of the electrophotographic layer and the leakage of the charge upon exposure remained uninfluenced.

As far as processing characteristics and printing behavior were concerned, the plate which had an improved coating quality, did not differ from a comparative plate which had been coated from a solvent mixture of 3 parts by weight of tetrahydrofuran, 2 parts by weight of ethylene glycol monomethyl ether and 1 part by weight of butyl acetate, without addition of a surfactant.

Another plate which had been prepared in the same way, but without addition of a surfactant and with ethylene glycol monomethyl ether as the only solvent showed a wrinkly structure which was perceivable even to the naked eye.

EXAMPLE 11

A solution of 10 p.b.w. of the diazonium salt condensation product specified in Example 5, 4 p.b.w. of the azo dye composed of 2,4-dinitro-6-chlorobenzene diazonium salt and 2-methoxy-5-acetylamino-N-hydroxyethyl-N-cyanoethylaniline, 1 p.b.w. of metanil yellow (Colour Index 13 065), 2 p.b.w. of phosphoric acid (85 percent) and 0.2 p.b.w. of the surfactant mentioned in Example 5 in 970 p.b.w. of ethylene glycol monomethyl ether was applied to an electrolytically roughened and anodized aluminum foil. A cloud-free, uniform layer was obtained.

EXAMPLE 12

A solution of 28 p.b.w. of a 50 percent strength aqueous dispersion of a terpolymer of vinyl acetate, ethylene and vinyl chloride, 4 p.b.w. of a 32 percent strength dispersion of copper phthalocyanine (Colour Index 74 160) in a 3:1 ethylene glycol/water mixture, 4 p.b.w. of the diazonium salt condensation product specified in Example 5, 0.3 p.b.w. of metanil yellow, 0.2 p.b.w. of phosphoric acid (85 percent), and 0.2 p.b.w. of a copolymer containing in its molecule 25 to 40 dimethyl siloxane units, 120 to 150 oxyethylene units and 80 to 100 oxypropylene units and having an average molecular weight of 13,500 in 970 p.b.w. of ethylene glycol monomethyl ether, was applied to an electrolytically roughened and anodized aluminum plate. The copying layer obtained was cloud-free. If however, the surfactant was omitted in the coating solution, the resulting layer was extremely cloudy and had a non-uniform thickness.

EXAMPLE 13

A solution of 14 p.b.w. of a copolymer of methyl methacrylate and methacrylic acid having an average molecular weight of 40,000 and an acid number ranging between 90 and 115, 14 p.b.w. of 1,1,1-trimethylolethane triacrylate, 2 p.b.w. of 1,6-bis-hydroxyethoxy-hexane, 0.5 p.b.w. of 9-(p-hydroxy-phenyl)-acridine and 0.02 p.b.w. of the surfactant used in Example 5 in 130 p.b.w. of ethylene glycol monoethyl ether was applied to an electrolytically roughened and anodized aluminum foil and dried thereon.

The photopolymerizable copying layer obtained was free of clouds and completely uniform.

The layer was exposed for 1 minute under an original, using a 5 kW xenon point lamp. It was then wiped over for 1 minute with a developer composed of 15 p.b.w. of sodium metasilicate×9 H$_2$O, 3 p.b.w. of polyglycol 6000, 0.6 p.b.w. of levulinic acid and 0.3 p.b.w. of strontium hydroxide×8 H$_2$O in 1000 p.b.w. of water, so that the unexposed layer areas were removed. Developing was followed by rinsing with water, fixing with 1 percent strength phosphoric acid and inking with black greasy ink. When the same coating composition, prepared, however, without addition of a surfactant, was applied from ethylene glycol monomethyl ether as the only solvent, the resulting copying layer was cloudy and non-uniform.

Similarly, a cloudy copying layer was obtained, when a mixture of 70 parts by volume of ethylene glycol monoethyl ether and 30 parts by volume of ethylene glycol monobutyl ether was used as the coating solvent. This layer required a longer exposure time compared with the layer which contained the surfactant.

EXAMPLE 14

A solution of 25 p.b.w. of bis-(5-ethyl-5-butyl-1,3-dioxane-2-yl)-ether of 2-ethyl-2-butyl-1,3-propane-diol, 71 p.b.w. of the cresol formaldehyde novolak used in Example 1, 3 p.b.w. of 2-(acenaphth-5-yl)-4,6-bis-trichloromethyl-s-triazine, 0.7 p.b.w. of Crystal Violet base and 0.2 p.b.w. of the surfactant specified in Example 5 in 900 p.b.w. of ethylene glycol monomethyl ether was applied to an electrolytically roughened and anodized aluminum foil and dried. The positive-acting copying layer obtained was free of clouds and showed a high coating quality.

The plate was exposed in the customary manner under an original and was then developed using the developer mentioned in Example 1.

Similar results were obtained, when the specified orthoester derivative was replaced by other orthocarboxylic acid esters, for example, as described in German Offenlegungsschrift No. 26 10 842 or when polyacetals were used, as described in German Offenlegungsschrift No. 27 18 254.

EXAMPLE 15

A solution of 2 p.b.w. of the ester of 1 mole of 2,3,4-trihydroxybenzophenone and 3 moles of naphthoquinone-(1,2)-diazide-(2)-5-sulfonic acid, 3 p.b.w. of Zapon Fast Blue HFL (Colour Index 74 350), 1 p.b.w. of Sudan Blue II (Colour Index 61554 S) and 0.02 p.b.w. of the surfactant specified in Example 5 in 94 p.b.w. of a mixture composed of 30 parts by volume of ethylene glycol monomethyl ether, 20 parts by volume of methyl ethyl ketone and 10 parts by volume of butyl acetate, was applied to a polyester film. The resulting coating on the film was completely free of clouds and exhibited a uniform coloration. This film could be used as a color proofing film.

If, however, a corresponding coating solution without addition of a surfactant was applied to the same support, the resulting layer showed extreme variations of color density.

EXAMPLE 16

For the preparation of a positive-acting dry resist, a solution was prepared from 11.15 p.b.w. of the novolak according to Example 1, 2.79 p.b.w. of a vinyl acetate/crotonic acid copolymer (95:5) having a molecular weight of 100,000, 4.18 p.b.w. of a copolymer comprising 5:1:2 parts of n-hexylmethacrylate/methyl methacrylate/methacrylic acid and having an acid number of 158, 2.79 p.b.w. of an epoxy resin having an epoxy equivalent weight of 190, 2.32 p.b.w. of the bis-naphthoquinone-(1,2)-diazide-(2)-sulfonic acid-(5)-ester of 4,4-bis-(4-hydroxy-phenyl)-valeric acid-3-methoxybutyl ester, 0.45 p.b.w. of naphthoquinone-(1,2)-diazide-(2)-sulfochloride-(4), 0.02 p.b.w. of the surfactant described in Example 1 and
0.06 p.b.w. of Crystal Violet in
48.34 p.b.w. of ethylene glycol monoethyl ether and
27.90 p.b.w. of methyl ethyl ketone.

This solution was applied to an about 25 μm thick polyester film which had been pretreated with an aqueous solution of 10 percent of trichloroacetic acid, 1 percent of polyvinyl alcohol and 0.1 percent of a surfactant, and was then dried. The coating obtained was very uniform.

The above-described solvent mixture was replaced by 76.24 parts by weight of ethylene glycol monoethyl ether, without thereby affecting the coating quality.

The about 20 μm thick resist layer was then provided with a polyethylene cover film to protect it from dust and scratches.

For the manufacture of circuit boards, the cover film was peeled off from the positive-acting dry resist film and then a commercial laminator was used to apply the film to a cleaned, about 35 μm thick copper foil which had been laminated to a support consisting of an insulating material. After peeling off the support film, if appropriate, drying again, exposing for about 3 minutes with the aid of a conventional exposure apparatus and spray-developing for about 2 minutes with a developer of the following composition 0.6 p.b.w. of NaOH,
0.5 p.b.w. of $Na_2SiO_3 \times 5\ H_2O$,
1.0 p.b.w. of n-butanol and
97.9 p.b.w. of water an excellent resist layer in imagewise distribution was obtained. It was not only resistant to the conditions prevailing in etching processes, for example, using $FeCl_3$, but also to the electroplating solutions used in the manufacture of through-hole printed circuits, in particular when successively electroplating with copper, nickel and gold.

EXAMPLE 17

A solution of
3.0 p.b.w. of the bis-naphthoquinone-(1,2)-diazide-(2)-sulfonic acid-(5)-ester of 4,4-bis-(4-hydroxy-phenyl)-valeric acid methyl ester,
21.0 p.b.w. of the phenol formaldehyde novolak according to Example 3,
3.0 p.b.w. of the vinyl acetate/crotonic acid copolymer of Example 16,
3.0 p.b.w. of an epoxy resin (epoxy equivalent weight about 450),
0.4 p.b.w. of Sudan Blue II (Colour Index Solvent Blue 35) and
0.02 p.b.w. of the surfactant specified in Example 1 in
49.6 p.b.w. of ethylene glycol monoethyl ether acetate,
10.0 p.b.w. of ethylene glycol monoethyl ether and
10.0 p.b.w. of butyl acetate or in
69.6 p.b.w. of ethylene glycol monoethyl ether
resulted in a positive-acting photoresist composition which was suitable for the manufacture of circuit boards, gravure printing cylinders and for use in chemical milling or in nickel-type stencils.

EXAMPLE 18

A solution of
2.8 p.b.w. of a terpolymer of methyl methacrylate, n-hexyl methacrylate and methacrylic acid (25:125:30) having an acid number of 202,
2.8 p.b.w. of the reaction product obtained by reacting 1 mole of 2,2,4-trimethyl-hexamethylene diisocyanate with 2 moles of hydroxyethyl methacrylate,
0.005 p.b.w. of the surfactant specified in Example 1,
0.5 p.b.w. of diethylene glycol monohexyl ether,
0.03 p.b.w. of tris-[4-(3-methyl-phenylamino)-phenyl]methyl acetate and
0.025 p.b.w. of 9-phenyl-acridine in
12 p.b.v. of ethylene glycol monoethyl ether
was spin-coated on a 25 μm thick polyethylene terephthalate film in such a way that after drying (for 8 minutes using a fan dryer, then for 3 minutes at 100° C. in a drying oven) a layer thickness of 25 μm was obtained. The layer had a very uniform thickness and did not show any variations in coloration. The dry resist film was laminated to a copper-clad plate of an insulating resin as described in Example 16 and was then exposed. After developing for 2 minutes, a cleanly developed image of the original was obtained. Developer resistance and etching resistance were excellent.

What is claimed is:

1. A light-sensitive copying material, comprising:
a support sheet; and
a dry light-sensitive layer which undergoes a change in solubility in an aqueous developer solution upon exposure to actinic light so that, when said layer is selectively exposed to a light image, selected areas of said layer can be dissolved in an aqueous developer solution and the remaining areas will resist dissolution in said aqueous developer solution to form a developed image corresponding to said light image, said light-sensitive layer comprising in admixture at least one light-sensitive component and from about 0.01 to about 10 percent by weight of a surface-active polysiloxane copolymer consisting essentially of dialkylsiloxane units and oxyalkylene units corresponding to the formulae

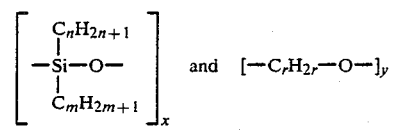

in which
m and n are integers ranging from 1 to 4,
r is an integer ranging from 2 to 5,
x is an integer ranging from about 10 to 100 and
y is an integer ranging from about 25 to 350, wherein said aqueous developer solution is comprised predominantly by weight of water.

2. A light-sensitive copying material as claimed in claim 1, wherein said surface-active polysiloxane copolymer is contained in said light-sensitive layer in a quantity sufficient to reduce in a linear manner by about 40 to 75 percent the spreading capacity on a support of a coating solution containing the layer components.

3. A light-sensitive copying material as claimed in claim 1, wherein said surface-active polysiloxane copolymer is contained in said light-sensitive layer in a quantity sufficient to reduce the surface tension of the light-sensitive layer towards water by 2 to 12 mN/m, as compared with a layer which is free of said polysiloxane.

4. A light-sensitive copying material as claimed in claim 1, wherein the solubility of said light-sensitive layer in an aqueous developer solution is increased by exposure to actinic light.

5. A light-sensitive copying material as claimed in claim 4, wherein said light-sensitive layer contains as the light-sensitive component an o-quinone diazide.

6. A light-sensitive copying material as claimed in claim 1, wherein the solubility of said light-sensitive layer in an aqueous developer solution is reduced by exposure to actinic light.

7. A light-sensitive copying material as claimed in claim 6, wherein said light-sensitive layer contains as the light-sensitive component a diazonium salt polycondensation product.

8. A light-sensitive copying material as claimed in claim 7, wherein said light-sensitive layer comprises a photopolymerizable layer.

9. A light-sensitive copying material produced by a process comprising the steps of
(1) coating a support sheet with a solution comprising in admixture of at least one light-sensitive component and from about 0.005 to about 1 percent of a surfactant dissolved in a single organic solvent to form a thin layer of the solution on the support sheet, said surfactant comprising a surface-active polysiloxane copolymer consisting essentially of dialkylsiloxane units and oxyalkylene units corresponding to the formulae

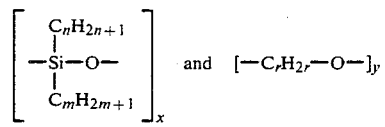

in which
m and n are integers ranging from 1 to 4,
r is an integer ranging from 2 to 5,
x is an integer ranging from about 10 to 100 and
y is an integer ranging from about 25 to 350; and
(2) drying the thin layer to remove the solvent therefrom to produce a cloud-free, optically homogeneous light-sensitive layer of uniform coloration and layer thickness on the support sheet, wherein said light-sensitive layer undergoes a change in solubility in an aqueous developer solution upon exposure to actinic light so that, when said layer is selectively exposed to a light image, selected areas of said layer can be dissolved in an aqueous developer solution and the remaining areas will resist dissolution in said aqueous developer solution to form a developed image corresponding to said light image, and wherein said aqueous developer solution is comprised predominantly by weight of water.

10. A light-sensitive copying material as claimed in claim 9, wherein said surface-active polysiloxane is present in a quantity sufficient to reduce the spreading capacity on the support sheet of the coating solution in a linear manner by about 40 to 75 percent.

* * * * *

UNITED STATES PATENT AND TRADEMARK OFFICE
CERTIFICATE OF CORRECTION

PATENT NO. : 4,510,227
DATED : April 9, 1985
INVENTOR(S) : Dieter MOHR and Kurt REISS It is certified that error appears in the above—identified patent and that said Letters Patent is hereby corrected as shown below:

IN THE BIBLIOGRAPHICAL DATA:

At item [75] Inventors: kindly correct the spelling of the second inventors name from "RIESS" to read -- REISS --.

Signed and Sealed this

Twenty-sixth Day of November 1985

[SEAL]

Attest:

DONALD J. QUIGG

Attesting Officer          Commissioner of Patents and Trademarks